(12) United States Patent
Yokogawa

(10) Patent No.: US 8,334,493 B2
(45) Date of Patent: Dec. 18, 2012

(54) OPTICAL ELEMENT AND SOLID-STATE IMAGING DEVICE FOR SELECTIVE ELECTROMAGNETIC COMPONENT EXTRACTION

(75) Inventor: Sozo Yokogawa, Tokyo (JP)

(73) Assignee: Sony Corporation, Tokyo (JP)

( * ) Notice: Subject to any disclaimer, the term of this patent is extended or adjusted under 35 U.S.C. 154(b) by 418 days.

(21) Appl. No.: 12/683,103

(22) Filed: Jan. 6, 2010

(65) Prior Publication Data

US 2010/0176280 A1 Jul. 15, 2010

(30) Foreign Application Priority Data

Jan. 13, 2009 (JP) ................. 2009-004457

(51) Int. Cl.
*H01L 27/00* (2006.01)
(52) U.S. Cl. ..................... 250/208.1; 250/226
(58) Field of Classification Search ............... 250/208.1, 250/226, 239; 257/291–294, 431–435, 440; 348/272, 273, 266
See application file for complete search history.

(56) References Cited

U.S. PATENT DOCUMENTS

| | | | | |
|---|---|---|---|---|
| 7,223,960 B2 * | 5/2007 | Mouli | ............ | 250/226 |
| 7,248,297 B2 * | 7/2007 | Catrysse et al. | ............ | 348/273 |
| 2007/0058055 A1 | 3/2007 | Yamaguchi et al. | | |
| 2008/0265349 A1 | 10/2008 | Kasano et al. | | |

FOREIGN PATENT DOCUMENTS

| | | |
|---|---|---|
| JP | 2008-177191 | 7/2008 |
| WO | 2005/013369 | 2/2005 |
| WO | 2005057657 | 6/2005 |
| WO | 2006/028128 | 3/2006 |
| WO | 2007118895 | 10/2007 |

OTHER PUBLICATIONS

JP Application No. 2009-004457; Office Action issued Mar. 10, 2011; 3 pages.
Yuichi Inaba et al.; Degradation-Free MOS Image Sensor With Photonic Crystal Color Filter; IEEE Electron Device Letters; vol. 27, No. 6; Jun. 2006.
Peter B. Catrysse and Brian A. Wandell; Integrated color pixels in 0.18-um complementary metal oxide semiconductor technology; Optical Society of America; vol. 20, No. 12; Dec. 2003.
Seh-Won Ahn et al.; Nanotechnology; LG; vol. 16, 1874-1877; 1005.
Paul F. Goldsmith; Quasioptical Systems; IEEE Press; ISBN 0-7803-3439-6.

* cited by examiner

*Primary Examiner* — Que T Le
(74) *Attorney, Agent, or Firm* — SNR Denton US LLP

(57) ABSTRACT

An optical element includes a first filter having the function to transmit a component at a lower frequency than a first cutoff frequency in incident light, a second filter having the function to transmit a component at a higher frequency than a second cutoff frequency in the incident light, and a light-receiving element for photoelectrically converting the components transmitted through the first filter and the second filter in the incident light. A metal optical filter composed of a conductor thin film is used as at least one of the first filter and the second filter.

10 Claims, 11 Drawing Sheets

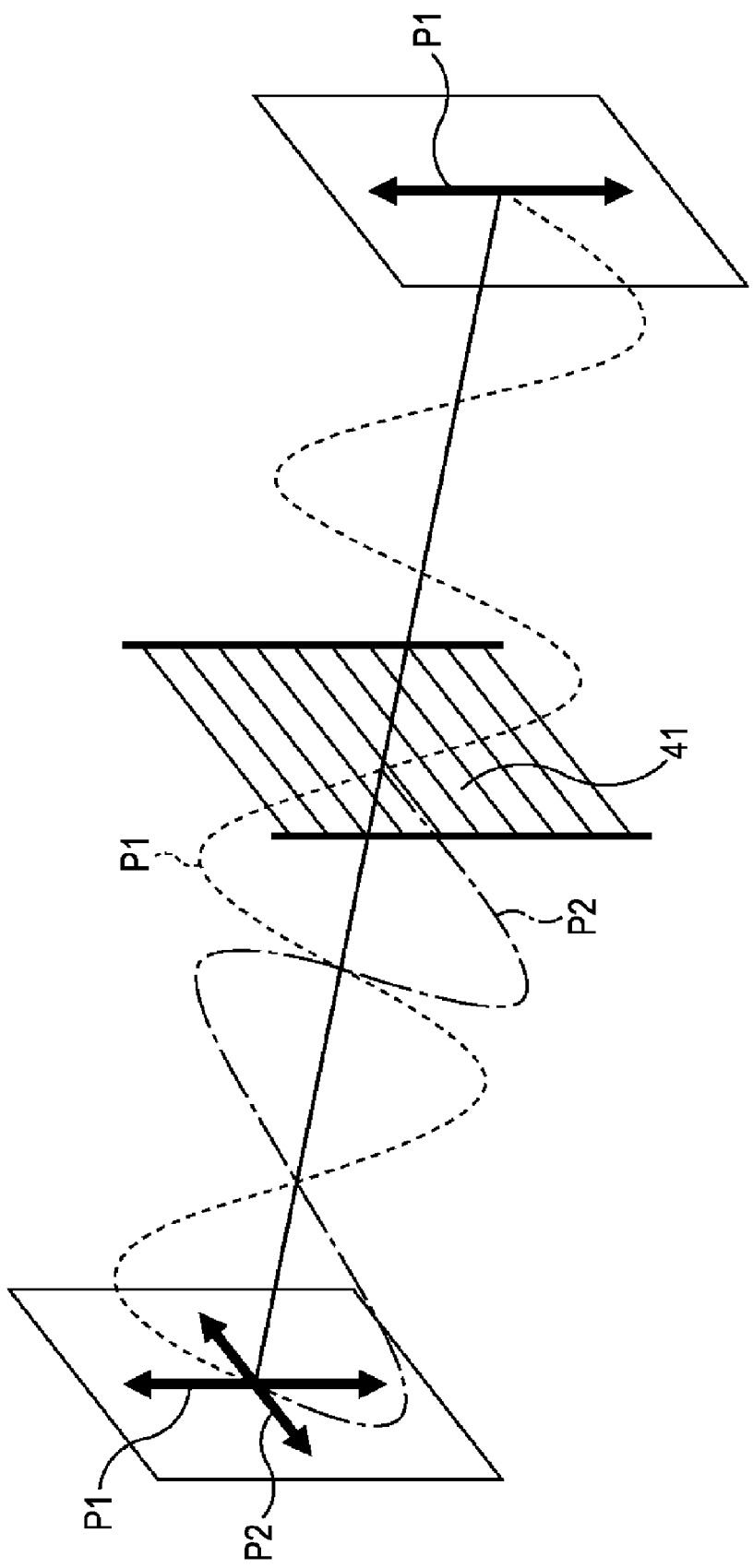

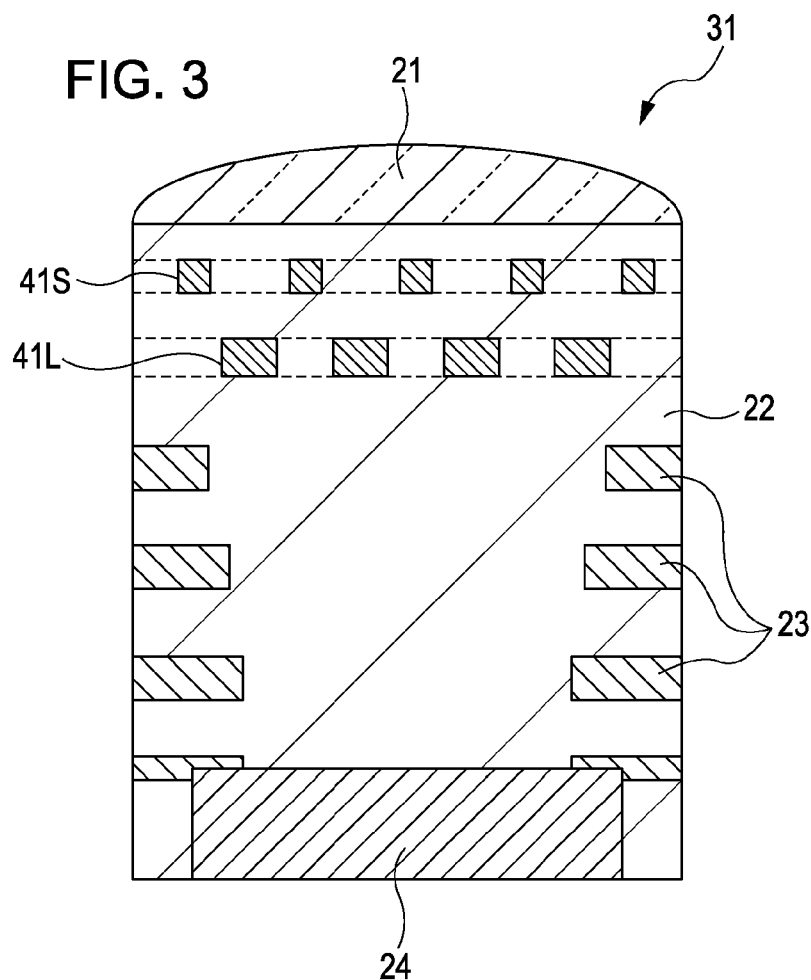
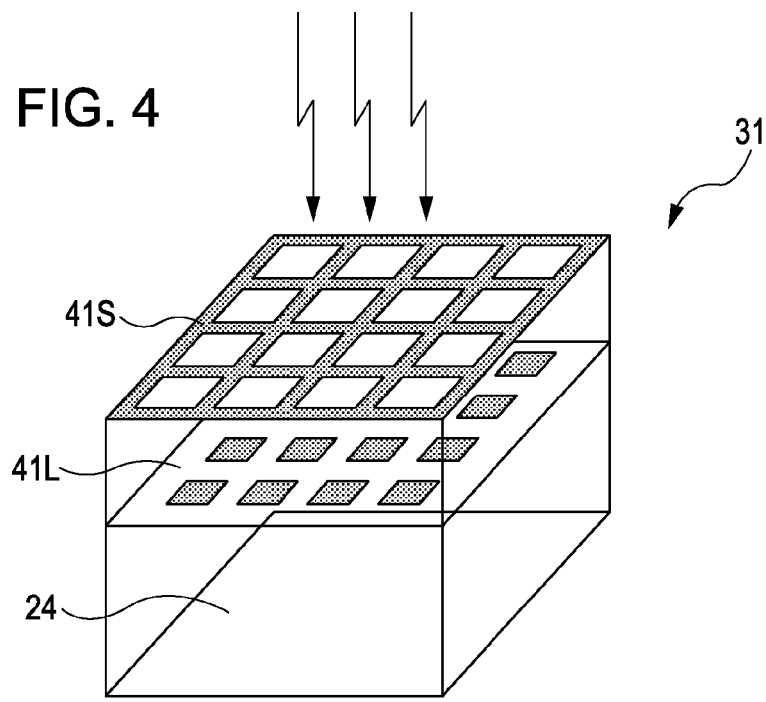

OPTICAL ELEMENT AND SOLID-STATE IMAGING DEVICE FOR SELECTIVE ELECTROMAGNETIC COMPONENT EXTRACTION

BACKGROUND OF THE INVENTION

1. Field of the Invention

The present invention relates to an optical element and a solid-state imaging device and particularly to an optical element and a solid-state imaging device which permit a technique of selectively extracting only an electromagnetic component at a specified wavelength to be realized by a chemically stable, low-cost, lower-profile structure.

2. Description of the Related Art

Electronic devices including solid-state imaging devices for imaging by photographing objects, such as a digital still camera, a camcorder, and the like, have recently increased. Currently mainstream solid-state imaging devices include a CCD (Charge Coupled Device) image sensor, a CMOS (Complementary Metal Oxide Semiconductor) image sensor, and the like. Hereinafter, these solid-state imaging devices are collectively named "CCD/CMOS image sensors". The CCD/CMOS image sensors have sensitivity in a wide range from a visible wavelength to a near-infrared wavelength. However, unlike the human eyes, CCD/CMOS image sensors may not discriminate between color information, for example, discriminate between red light and blue light. Therefore, in a usual CCD/CMOS image sensor, a color filter which transmits an electromagnetic wave only at a specified wavelength, such as red (R), green (G), blue (B), a complementary color (cyan (Cy), magenta (Mg), yellow (Ye), green (G)), or the like is provided on the front surface of each pixel. By using such a usual CCD/CMOS image sensor, intensity information of each color is obtained from the intensity of transmitted light, and a color image is formed by signal processing of the intensity information of each color.

For the color filters used in the usual CCD/CMOS image sensor, organic raw materials such as a pigment, a dye, and the like are often used. However, the bonding energy of molecules including carbon and hydrogen which are constituent components of the color filter is substantially the same as ultraviolet energy. Therefore, when the color filter is irradiated with high-energy light for a long time, carbon bonds and carbon-hydrogen bonds may be broken. Therefore, in outdoor use for a long time in which the color filter is exposed to sunlight including ultraviolet light, use in an environment in which ultraviolet light is particularly strong, or the like (e.g., climbing, ski, play in the sea, or the like), the transmission characteristics of the color filter change. As a result, the characteristic of color reproduction of a taken image may deteriorate (refer to, for example, IEEE Electron Device Letters, Vol. 27, No. 6, June 2006, p 457-459).

Therefore, color filters using inorganic materials or photonic crystals have been put into practical use (refer to, for example, Domestic Re-publication of PCT International Publication for Patent Application Nos. 2006/028128 and 2005/013369). Further, color filters referred to as "wire grids" or "metal optical filters" (in the specification, unified to the name "metal optical filters" hereinafter) have been proposed (refer to, for example, Quasioptical Systems, Paul F. Goldsmith, IEEE Press, ISBN 0-7803-3439-6, J. Opt. Soc. Am. A, P. B. Catrysse & B. A. Wandell, Vol. 20, No. 12, December 2003, p. 2293-230, and Nanotechnology, Seh-Won Ahn et al., Vol. 16, 1874-1877, 2005 (LG)).

SUMMARY OF THE INVENTION

In a CCD/CMOS image sensor, it is desired to realize a technique of selectively extracting only an electromagnetic component at a specified wavelength by a chemically stable, low-cost, lower-profile structure. However, in the present situation, the color filters described in Domestic Re-publication of PCT International Publication for Patent Application Nos. 2006/028128 and 2005/013369, IEEE Electron Device Letters, Vol. 27, No. 6, June 2006, p 457-459, Quasioptical Systems, Paul F. Goldsmith, IEEE Press, ISBN 0-7803-3439-6, J. Opt. Soc. Am. A, P. B. Catrysse & B. A. Wandell, Vol. 20, No. 12, December 2003, p. 2293-230, and Nanotechnology, Seh-Won Ahn et al., Vol. 16, 1874-1877, 2005 (LG) do not sufficiently satisfy the desire.

It is desirable to permit a technique of selectively extracting only an electromagnetic component at a specified wavelength to be realized by a chemically stable, low-cost, lower-profile structure.

An optical element according to an embodiment of the present invention includes a first filter having the function to transmit a component at a lower frequency than a first cutoff frequency in incident light, a second filter having the function to transmit a component at a higher frequency than a second cutoff frequency in the incident light, and a light-receiving element for photoelectric conversion of the components transmitted through the first filter and the second filter in the incident light, a metal optical filter composed of a conductor thin film being used as at least one of the first filter and the second filter.

In an optical element according to an embodiment of the present invention, photoelectric conversion is made for each of the components transmitted through a first filter having the function to transmit a component at a lower frequency than a first cutoff frequency in incident light, and a second filter having the function to transmit a component at a higher frequency than a second cutoff frequency in the incident light. A metal optical filter composed of a conductor thin film is used as at least one of the first filter and the second filter.

A solid-state imaging device according to an embodiment of the present invention includes a plurality of optical elements arranged as pixels in a matrix, the optical elements each including a first filter which transmits a component at a lower frequency than a first cutoff frequency in incident light, a second filter which transmits a component at a higher frequency than a second cutoff frequency in the incident light, and a light-receiving element for photoelectrically converting the components transmitted through the first filter and the second filter in the incident light, a metal optical filter composed of a conductor thin film being used as at least one of the first filter and the second filter.

The metal optical filter includes a metallic portion made of the conductor thin film and a medium portion filled with a medium for an electromagnetic wavelength to which the solid-state imaging device has sensitivity.

The metal optical filter includes a metallic lattice portion made of the conductor thin film, a gap portion of the metallic lattice portion being filled with a medium which transmits an electromagnetic wavelength to which the solid-state imaging device has sensitivity.

In the metal optical filter, one of the metallic portion and the medium portion has a lattice- or honeycomb-like distribution structure, the other being disposed in the one.

In the metal optical filter, the lattice- or honeycomb-like distribution structure is determined on the basis of a wavelength in the medium corresponding to the first cutoff frequency or the second cutoff frequency.

The optical element further includes, in addition to the first filter and the second filter, at least one filter having the function of the first filter or the second filter.

The first filter and the second filter are stacked in the incidence direction of the incident light.

The optical element further includes an on-chip condensing element, the first filter and the second filter being disposed between the on-chip condensing element and the light-receiving element.

The optical element further includes a metal wiring layer provided between the on-chip condensing element and the light-receiving element, the first filter and the second filter being disposed in the metal wiring layer.

In the solid-state imaging device, in a central portion, the optical axis of the light-receiving element coincides with the optical axes of the first filter and the second filter, while in a portion at a distance from the central portion, the light-receiving element and the first and second filters have a positional relationship which is offset toward the central portion according to the distance of the portion.

In a solid-state imaging device according to an embodiment of the present invention, a plurality of optical elements serving as pixels are arranged in a matrix. In each of the optical elements, photoelectric conversion is made for a component transmitted through a first filter having the function to transmit a component at a lower frequency than a first cutoff frequency in incident light and a component transmitted through a second filter having the function to transmits a component at a higher frequency than a second cutoff frequency in the incident light. A metal optical filter composed of a conductor thin film is used as at least one of the first filter and the second filter.

According to an embodiment of the present invention, as described above, a technique of selectively extracting only an electromagnetic wave at a specified wavelength may be realized by a chemically stable, low-cost, lower-profile structure.

BRIEF DESCRIPTION OF THE DRAWINGS

FIG. 2 is a drawing showing a metal optical filter composed of a conductor and having a one-dimensional lattice structure;

FIG. 3 is a sectional view showing an example of a configuration of a pixel portion of a solid-state imaging device according to a first embodiment of the present invention;

FIG. 4 is a perspective view showing the pixel portion of the solid-state imaging device shown in FIG. 3, in which an on-chip light collecting element, a smoothing layer, and metal wiring are not shown;

DESCRIPTION OF THE PREFERRED EMBODIMENTS

1. Usual Solid-State Imaging Device

First, outlines of a usual solid-state imaging device are described in order to facilitate understanding of the present invention.

Figure 1:
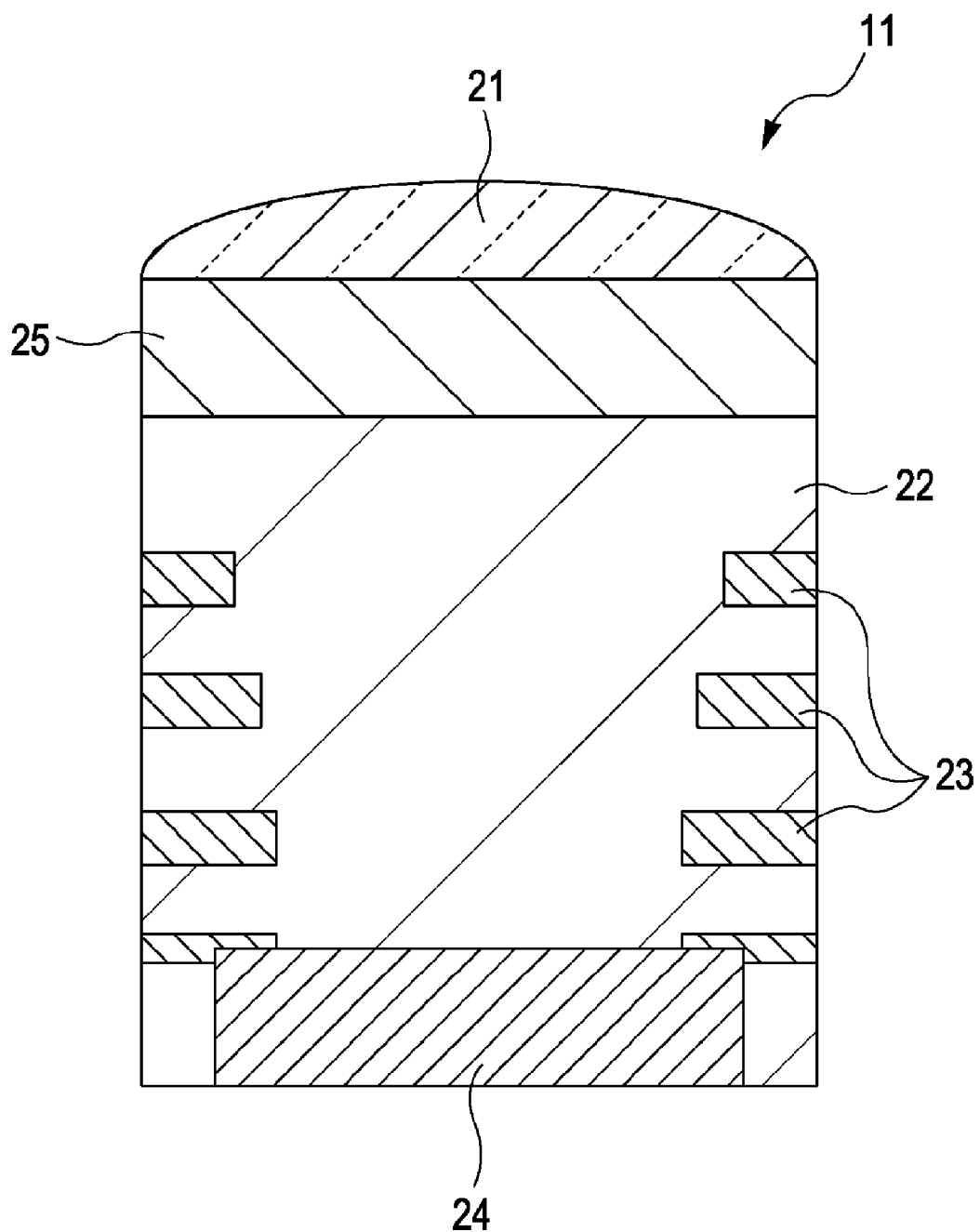
FIG. 1 is a sectional view showing a pixel portion of a CMOS image sensor as an example of a usual field-amplifying solid-state imaging device.

FIG. 1 is a sectional view showing a pixel portion of a CMOS image sensor 11 as an example of a usual field-amplifying solid-state imaging device.

The pixel portion of the usual solid-state imaging device 11 is configured to include an on-chip light-collecting element 21 (microlens 21), smoothing layers 22, metal wiring 23, a photosensor 24, and an on-chip color filter layer 25.

In the pixel portion of the usual solid-state imaging device 11, the photosensor 24 is disposed at the bottom, and the four smoothing layers 22 and the three metal wiring layers 23 are alternately laminated on the photosensor 24. Namely, each of the smoothing layers 22 is laminated for smoothing an underlying surface when an upper layer is laminated. The on-chip color filter layer 25 and the on-chip light-collecting element 21 are laminated on the uppermost smoothing layer 22 in that order from below.

Therefore, the on-chip color filter layer 25 is disposed between the on-chip light-collecting element 21 and the smoothing layers 22.

As the on-chip color filter layer 25, a color filter (hereinafter referred to as an "organic color filter") using an organic material as disclosed in IEEE Electron Device Letters, Vol. 27, No. 6, June 2006, p 457-459 is frequently used.

However, the organic color filter has the disadvantage that it has low resistance to high-energy light such as ultraviolet light and the like. Therefore, in recent years, a color filter using an inorganic material or a photonic crystal has been gradually put into practical use as the on-chip color filter layer 25.

As an example of a color filter using an inorganic material, Domestic Re-publication of PCT International Publication for Patent Application No. 2006/028128 discloses an amorphous silicon thin film using the wavelength dependence of the absorption coefficient of an inorganic material. The absorption coefficient of amorphous silicon in the visible wavelength region decreases as the wavelength increases. Therefore, when a thin film having a specified thickness is considered, the thin film more easily transmits an electromagnetic wave at a wavelength of 0.7 μm than an electromagnetic wave at a wavelength of 0.5 μm. Therefore, a color filter (referred to as a "long-pass filter" hereinafter) which preferentially transmits a long wavelength may be easily realized by controlling the thickness. Further, amorphous silicon is an inorganic material, and thus the disadvantage of the organic color filter that it deteriorates by ultraviolet light may be overcome. However, it is difficult to realize a color filter (referred to as a "short-pass filter" hereinafter) which preferentially transmits a short wavelength. Further, in the color filter disclosed in Domestic Re-publication of PCT International Publication for Patent Application No. 2006/028128, arithmetic processing is also performed for color separation.

As an example of a color filter using a photonic crystal, Domestic Re-publication of PCT International Publication for Patent Application No. 2005/013369 discloses a photonic filter. The photonic filter includes optical materials having different refractive indexes and periodically laminated with a controlled space. The photonic filter produces multiple reflection selectively for an electromagnetic wave at a specified wavelength so that an electromagnetic wave at a desired wavelength or with a desired band width is extracted. However, the photonic filter may not sufficiently cut an electromagnetic wave with a small number of layers, and thus a multi-layer film is desired. Therefore, the photonic filter is thicker than the organic filter. Further, the photonic filter uses a crystal which is precisely grown by a high crystal operation technique and is thus inferior to the organic color filter from the viewpoint of cost.

When the usual color filter is simply used as the on-chip color filter layer 25, a chemically stable, low-cost, lower-profile structure is not achieved. Therefore, in order to achieve such a structure, the inventors found a method using a metal optical filter as an on-chip color filter of a solid-state imaging device. Outlines of a metal optical filter are described below.

2. Outlines of Metal Optical Filter

A metal optical filter is mainly used in a band of electromagnetic waves such as microwaves, millimeter waves, sub-millimeter waves, and the like at longer wavelengths than visible wavelengths (refer to, for example, Quasioptical Systems, Paul F. Goldsmith, IEEE Press, ISBN 0-7803-3439-6). Therefore, the metal optical filter is little applied to a visible wavelength band. As few examples, a research group of US Stanford University has reported that an inductive grid and a Fabry-Perot interferometer-type metal optical filter are effective as a spectroscopic element in a visible wavelength band (refer to, for example, J. Opt. Soc. Am. A, P. B. Catrysse & B. A. Wandell, Vol. 20, No. 12, December 2003, p. 2293-2306). The prime reason why an application example remained in research and development in the past is that it was difficult to technically realize a metal optical filter structure with a shorter physical length than visible wavelengths. However, in recent years, metal optical filter processing with a line width of 50 nm or less has been becoming possible (refer to, for example, Nanotechnology, Seh-Won Ahn et al., Vol. 16, 1874-1877, 2005 (LG)). Therefore, a metal optical filter may be used as a filter in the visible wavelength band, i.e., as a color filter.

FIG. 2 shows a metal optical filter 41 having a one-dimensional lattice structure composed of a conductor.

As a one-dimensional lattice structure, an example shown in FIG. 2 uses a structure in which a lattice extends in the transverse direction, but the extension direction is not limited to the transverse direction and may be any desired direction.

When the lattice spacing of the metal optical filter 41 is shorter than an electromagnetic wavelength, an electromagnetic wave vibrating in a plane parallel to the lattice is selectively reflected or absorbed by the lattice composed of the conductor. Therefore, in the example shown in FIG. 2, when incident light including longitudinally polarized wave P1 and transversely polarized wave P2 is transmitted through the metal optical filter 41, the transversely polarized wave P2 vibrating in a plane parallel to the lattice is reflected or absorbed by the lattice of the metal optical filter 41. As a result, the longitudinally polarized wave P1 becomes dominant linearly polarized light.

On the other hand, although not shown in a drawing, when the metal optical filter 41 has a two-dimensional lattice structure composed of a conductor, a component at a wavelength longer than the lattice spacing is selectively reflected or effectively absorbed by a lattice extending longitudinally and transversely. Therefore, the metal optical filter 41 may exhibit the function of a frequency filter which selectively transmits only an incident light component at a wavelength shorter than the lattice spacing.

As described above, the metal optical filter 41 has a lattice structure composed of a conductor (metal) and is thus considered as a low-cost chemically stable filter. In addition, the typical thickness of the conductor thin film of the metal optical filter 41 is as small as about 100 nm. Therefore, use of the metal optical filter 41 as an on-chip color filter contributes to lowering of the profile of a solid-state imaging device as compared with use of the above-described usual organic filter.

However, only a long-pass or short-pass filter is realized by simply using the metal optical filter 41 as the on-chip color filter. Namely, a technique for selectively extracting only wavelength components within a desired range (a range between a desired upper limit wavelength and a desired lower limit wavelength) is not realized by only using the metal optical filter 41 as the on-chip color filter. That is, a band-pass filter in a desired wavelength band is not realized.

Therefore, in order to realize a band-pass filter in a desired wavelength band, the inventors found a method of using two or more color filter layers as the on-chip color filter, the metal optical filter 41 being used as at least one of the layers.

As the two or more color filter layers, at least a first filter and a second filter which will be described below are used. The metal optical filter 41 is used as at least one of the first filter and the second filter. The first filter has the function to transmit a component at a lower frequency than a first cutoff frequency in incident light. The second filter has the function to transmit a component at a higher frequency than a second cutoff frequency in incident light.

As an embodiment in which the method of the present invention is applied to a solid-state imaging device, the following first to fourth embodiments are described in order.

1. First embodiment (metal optical filters 41S and 41L are applied)

2. Second embodiment (a metal optical filter 41S and a thin film filter 61 are applied)

3. Third embodiment (a metal optical filter 41 is mounted in the same layer as metal wiring 23)

4. Fourth embodiment (a configuration different from those of the first to third embodiments is used as a configuration of a metal optical filter 41)

3. Solid-State Imaging Device According to First Embodiment of the Present Invention FIG. 3 is a sectional view showing an example of a configuration of a pixel portion of a solid-state imaging device 31 according to a first embodiment of the present invention.

In FIG. 3, a portion corresponding to FIG. 1 is denoted by the same reference numeral. Description of such a portion is appropriately omitted. This applies to the drawings described below.

The pixel portion of the solid-state imaging device 31 is configured to include an on-chip light-collecting element 21, a smoothing layer 22, metal wiring 23, a photosensor 24, and metal optical filters 41S and 41L.

In the pixel portion of the solid-state imaging device 31, the photosensor 24 is disposed at the bottom, and the four smoothing layers 22 and the three metal wiring layers 23 are alternately laminated on the photosensor 24. Namely, each of the smoothing layers 22 is laminated for smoothing an underlying surface when an upper layer is laminated. The metal optical filters 41L and 41S and the on-chip light-collecting element 21 are laminated on the uppermost smoothing layer 22 in that order from below. The direction of lamination of the metal optical filters 41L and 41S is the propagation direction (incidence direction) of electromagnetic waves in the solid-state imaging device 31.

FIG. 4 is a perspective view showing the pixel portion of the solid-state imaging device 31 shown in FIG. 3, in which the on-chip light collecting element 21, the smoothing layers 22, and the metal wiring 23 are not shown.

In FIG. 4, a filled pattern region (gray region) in each of the metal optical filter 41S and the metal optical filter 41L indicates a conductor. A white region around the conductor indicates a gap portion filled with a medium. This applies to the drawings described below.

The metal optical filter 41S is configured to, for example, function as a short-pass filter. Specifically, for example, the metal optical filter 41S is configured to transmit only an electromagnetic wave component at a predetermined wavelength (referred to as a "first threshold value" hereinafter) or less.

On the other hand, the metal optical filter 41L is configured to, for example, function as a long-pass filter. Specifically, for example, the metal optical filter 41L is configured to transmit only an electromagnetic wave component at a predetermined wavelength (referred to as a "second threshold value" hereinafter) or more.

In this case, of light incident on the solid-state imaging device 31 from an upper portion in FIG. 4, a component at a high wavelength exceeding the first threshold value is reflected or absorbed by the metal optical filter 41S, and only a component at a wavelength of the first threshold value or less is transmitted. Of the light component transmitted through the metal optical filter 41S, a component at a short wavelength of less than the second threshold value is reflected or absorbed by the metal optical filter 41L, and only a component at a wavelength of the second threshold value or more is transmitted. As a result, of the light incident on the solid-state imaging device 31, only a component at a wavelength of the first threshold value or less and the second threshold value or more reaches the photosensor 24, and only the reaching component is photoelectrically converted by the photosensor 24.

Therefore, a band-pass filter which transmits only a component at a wavelength of the first threshold value or less and the second threshold value or more is easily realized by laminating the metal optical filter 41S and the metal optical filter 41L.

The first threshold value is set to any desired value by changing the lattice spacing and the line width of the metal optical filter 41S. Similarly, the second threshold value is set to any desired value by changing the lattice spacing and the line width of the metal optical filter 41L. Therefore, the function as a band-pass filter with any desired frequency band may be realized by optimizing the lattice spacings and the line widths of the metal optical filters 41S and 41L.

The solid-state imaging device 31 according to the first embodiment of the present invention has the two metal optical filter layers 41 as a basic structure. However, in order to improve characteristics such as antireflection, transmission efficiency, band width, and the like, three or more metal optical filter layers 41 may be provided as a basic structure.

Next, an example of a configuration of each of the metal optical filters 41S and 41L is described with reference to FIGS. 5 and 6.

Figure 5:
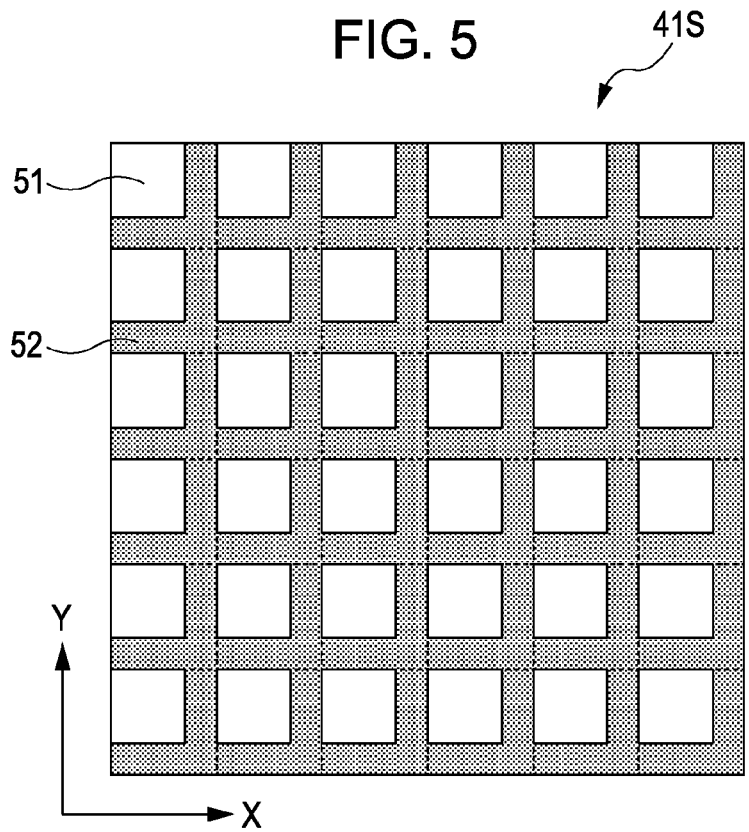
FIG. 5 is a top view showing an example of a configuration of a metal optical filter functioning as a short pass filter.

FIG. 5 is a top view showing an example of a configuration of the metal optical filter 41S functioning as a short-pass filter.

As shown in FIG. 5, the metal optical filter 41S includes a metallic portion 52 and a gap portion 51. The metallic portion 52 has a lattice distribution structure. The gap portion 51 is filled with a medium. Hereinafter, not only the gap portion 51 but also a gap portion filled with a medium is appropriately referred to as a "medium portion". The metallic portion 52 is composed of an electrically conductive metal thin film. The material of the metallic portion 52 is preferably a material used in a usual semiconductor process. Of course, any one of various conductive materials such as germanium, gallium arsenide, tungsten, silver, gold, carbon tubes, graphene, and the like may be used as long as the material is conductive and suitable of micro processing. In addition, for example, nanowires composed of a conductive material may be arranged in a lattice to form the metallic portion 52. On the other hand, the medium in the medium portion 51 is preferably a medium which transmits an electromagnetic wave to which the photosensor 24 has sensitivity, for example, $SiO_2$, $Si_3N_4$, $MgF_2$, $TiO_2$, $Ta_2O_5$, or the like.

The metallic portion 52 has a two-dimensional periodic structure in a XY plane of FIG. 5. The length of one period (lattice spacing) is may be, for example, substantially the same as the wavelength of an electromagnetic wave in the medium of the medium portion 51. Specifically, for example, as a typical example of one period length of the lattice structure, a case of transmission of light at a visible wavelength (light of R, G, and B) is considered. In this case, the wavelengths $\lambda R0$, $\lambda G0$, and $\lambda B0$ of R, G, and B lights are about $\lambda R0=600$ to 800 nm, $\lambda G0=500$ to 600 nm, and $\lambda B0=380$ to 500 nm, respectively. When the refractive index of the medium is represented by n, the wavelength in the medium is $\lambda=\lambda 0/n$. Therefore, when the refractive index n of the medium in the medium portion 51 is 1.5, the wavelengths $\lambda R$, $\lambda G$, and $\lambda B$ in the medium are $\lambda R=400$ to 530 nm, $\lambda G=330$ to 400 nm, and $\lambda B=250$ to 330 nm, respectively. The wavelength $\lambda$ (=1/f) corresponding to the cutoff frequency f of the metal optical filter 41S corresponds to 0.5 to 2 times the lattice spacing. Therefore, the structure period of the metallic portion 52, i.e., the filter spacing, is preferably the following length. The filter spacing for transmitting light at a shorter wavelength than $\lambda=700$ nm (the first threshold value $\lambda=700$ nm) is preferably 250 to 900 nm. The filter spacing for transmitting light at a shorter wavelength than $\lambda=550$ nm (the first threshold value $\lambda$=550 nm) is preferably 200 to 700 nm. The filter spacing for transmitting light at a shorter wavelength than $\lambda$=450 nm (the first threshold value $\lambda$=450 nm) is preferably 150 to 600 nm. The line width of the conductor constituting the metallic portion 52 is preferably about 100 nm or less, and the thickness of the optical metal filter 41S (thickness of the metallic portion 52) is preferably about 10 nm or more. However, when the metallic portion 52 is excessively thick, the transmittance of wavelength significantly decreases, and thus the thickness is more preferably 1 µm or less.

Figure 6:
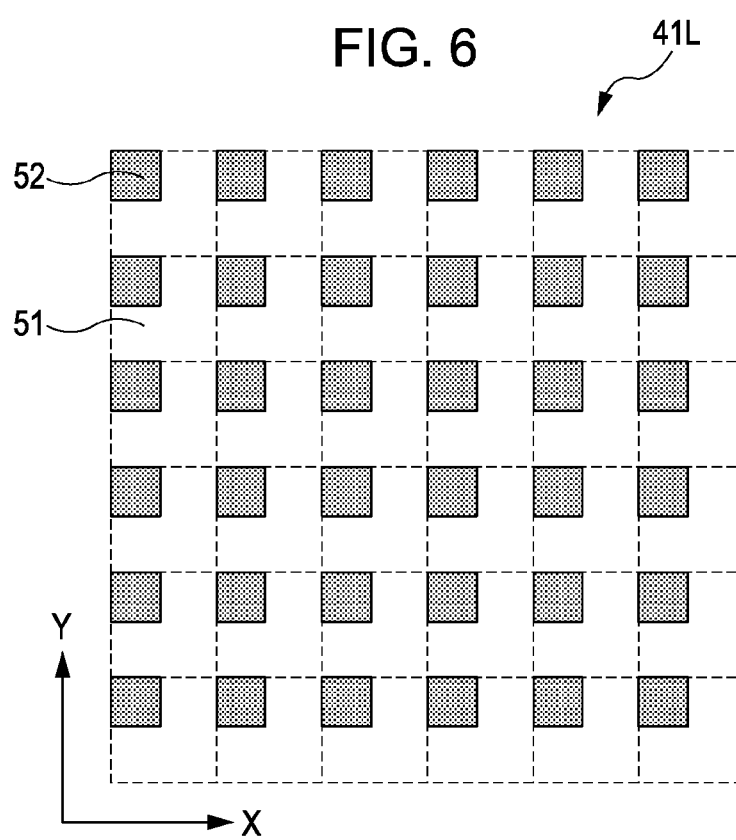
FIG. 6 is a top view showing an example of a configuration of a metal optical filter functioning as a long pass filter.

FIG. 6 is a top view showing an example of a configuration of the metal optical filter 41L functioning as a long-pass filter.

As shown in FIG. 6, the metal optical filter 41L has a basic structure in which the metallic portion 52 and the medium portion 51 of the metal optical filter 41S shown in FIG. 5 are reversed. Namely, the medium portion 51 has a lattice distribution structure. The materials preferred for the metallic portion 52 and the medium portion 51 of the metal optical filter 41L are the same as those described with reference to FIG. 5 and thus are not described.

The medium portion 51 has a two-dimensional periodic structure in a XY plane of FIG. 6. For example, as a typical example of one period length of the lattice structure, a case of transmission of light at a visible wavelength (light of R, G, and B) is considered. In this case, the wavelengths of R, G, and B lights are the same as those described above with reference to FIG. 5. The wavelength $\lambda$ (=1/f) corresponding to the cutoff frequency f of the metal optical filter 41L corresponds to 0.5 to 2 times the lattice spacing. Therefore, the structure period of the medium portion 51, i.e., the filter spacing, is preferably the following length. The filter spacing for transmitting light at a longer wavelength than $\lambda$=550 nm (the second threshold value $\lambda$=550 nm) is preferably 200 to 700 nm. The filter spacing for transmitting light at a longer wavelength than $\lambda$=450 nm (the second threshold value $\lambda$=450 nm) is preferably 150 to 600 nm. The filter spacing for transmitting light at a longer wavelength than $\lambda$=350 nm (the second threshold value $\lambda$=350 nm) is preferably 120 to 450 nm. The line width of the medium constituting the medium portion 51 is preferably about 50 nm. The thickness of the optical metal filter 41L (thickness of the metallic portion 52) is preferably 10 nm or more.

Although the metal optical filters 41S and 41L may be produced by a usual semiconductor process, of course, the production method is not particularly limited. For example, the following method may be used. First, the conductor thin film of the metallic portion 52 is preferably formed by sputtering, vacuum evaporation, chemical vapor deposition, or the like. However, when it is difficult to form the conductor thin film by sputtering, a method of forming a film by electroplating or the like may be used. The lattice structure may be realized by applying a resist and then patterning by reduced projection exposure. In this case, an electromagnetic wave at as short a wavelength as possible, such as g line or i line of a high-pressure mercury lamp, KrF excimer laser, ArF excimer laser, X rays, electron beams, or the like, is preferably used as an exposure light source. As etching, anisotropic dry etching is preferably used. A gas used for etching is preferably carbon tetrafluoride, sulfur hexafluoride, trifluoromethane, xenon difluoride, or the like. However, physical etching may be used. Although repeatedly described, of course, a production method other than the above-described method may be used.

Figure 7:
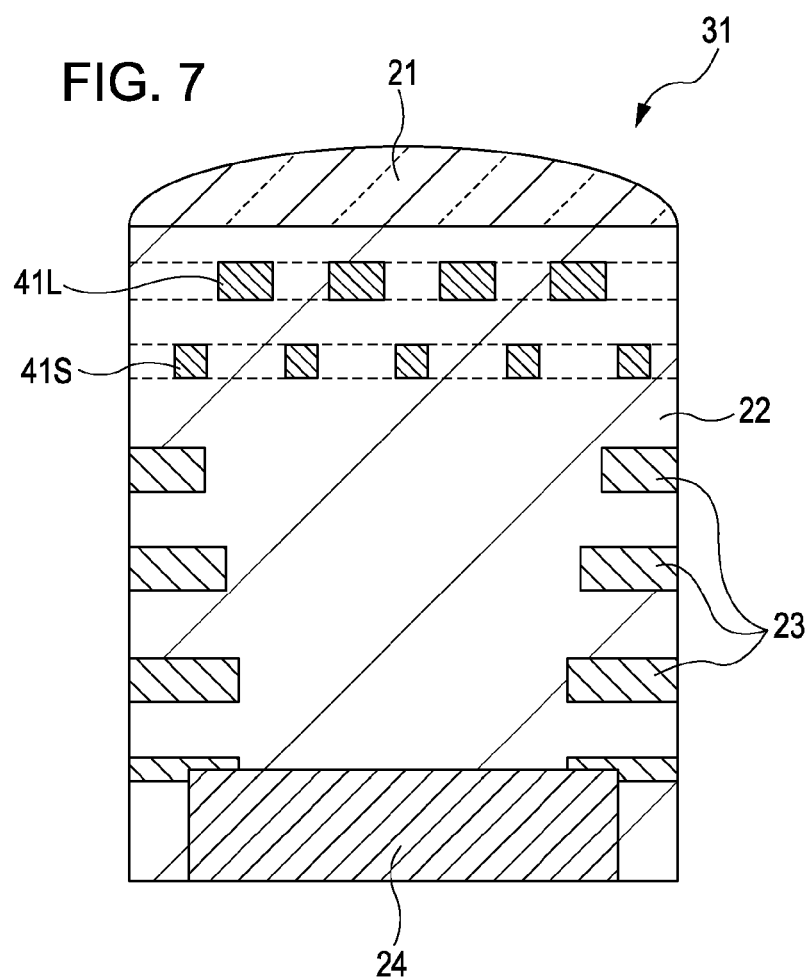
FIG. 7 is a sectional view showing an example of the configuration of the pixel portion of the solid-state imaging device according to the first embodiment of the present invention, the example being different from that shown in FIG. 3.

FIG. 7 is a sectional view showing an example of the configuration of the pixel portion of the solid-state imaging device 31 according to the first embodiment of the present invention, this example being different from that shown in FIG. 3.

The pixel portion of the solid-state imaging device 31 of the example shown in FIG. 7 has a configuration in which the positions of the metal optical filter 41S and the metal optical filter 41L of the example shown in FIG. 3 are interchanged.

In the pixel portion of the solid-state imaging device 31, the photosensor 24 is disposed at the bottom, and the four smoothing layers 22 and the three metal wiring layers 23 are alternately laminated on the photosensor 24. Namely, each of the smoothing layers 22 is laminated for smoothing an underlying surface when an upper layer is laminated. The metal optical filters 41S and 41L and the on-chip light-collecting element 21 are laminated on the uppermost smoothing layer 22 in that order from below. The direction of lamination of the metal optical filters 41L and 41S is the propagation direction (incidence direction) of electromagnetic waves in the solid-state imaging device 31.

Figure 8:
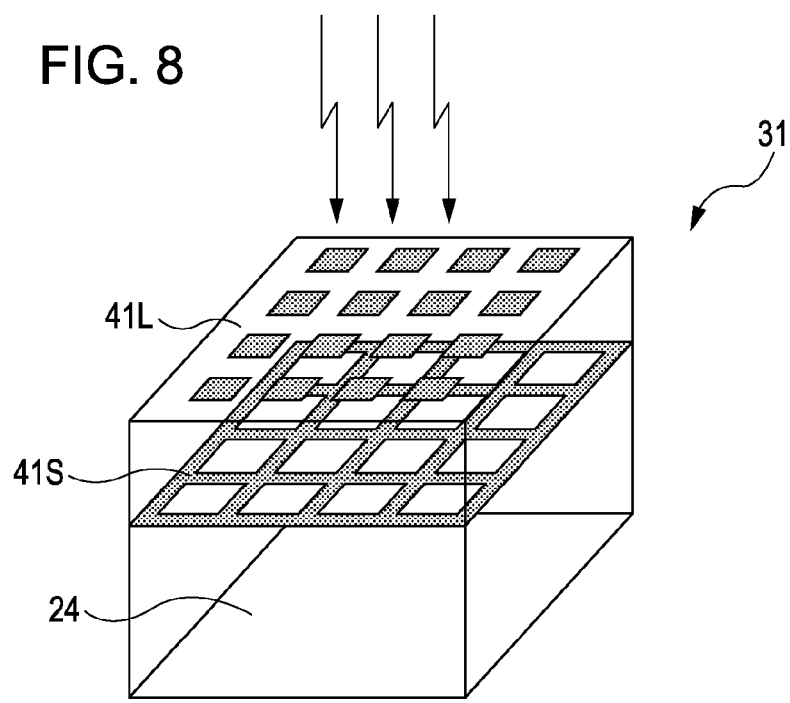
FIG. 8 is a perspective view showing the pixel portion of the solid-state imaging device shown in FIG. 7, in which an on-chip light collecting element, a smoothing layer, and metal wiring are not shown.

FIG. 8 is a perspective view showing the solid-state imaging device 31 shown in FIG. 7, in which the on-chip light collecting element 21, the smoothing layers 22, and the metal wiring 23 are not shown.

Of light incident on the solid-state imaging device 31 from an upper portion in FIG. 8, a component at a short wavelength of less than the second threshold value is reflected or absorbed by the metal optical filter 41L, and only a component at a wavelength of the second threshold value or more is transmitted. Of the light component transmitted through the metal optical filter 41L, a component at a long wavelength exceeding the first threshold value is reflected or absorbed by the metal optical filter 41S, and only a component at a wavelength of the first threshold value or less is transmitted. As a result, of the light incident on the solid-state imaging device 31, only a component at a wavelength of the first threshold value or less and the second threshold value or more reaches the photosensor 24, and only the reaching component is photoelectrically converted by the photosensor 24.

Therefore, a band-pass filter which transmits only a component at a wavelength of the first threshold value or less and the second threshold value or more is easily realized by laminating the metal optical filter 41L and the metal optical filter 41S.

4. Solid-State Imaging Device According to Second Embodiment of the Present Invention FIG. 9 is a sectional view showing an example of a configuration of a pixel portion of a solid-state imaging device 31 according to a second embodiment of the present invention.

Figure 9:
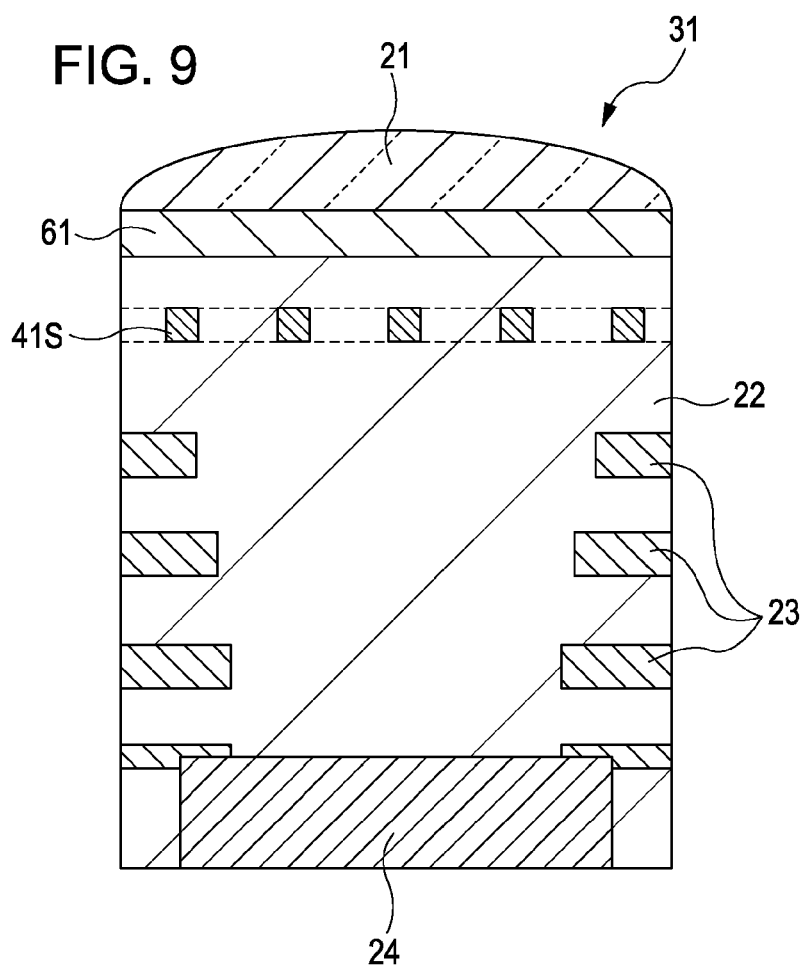
FIG. 9 is a sectional view showing an example of a configuration of a pixel portion of a solid-state imaging device according to a second embodiment of the present invention.

In the example shown in FIG. 9, the pixel portion of the solid-state imaging device 31 has a configuration in which a thin film filter 61 is used in place of the metal optical filter 41L of the example shown in FIG. 7.

In the pixel portion of the solid-state imaging device 31, the photosensor 24 is disposed at the bottom, and the four smoothing layers 22 and the three metal wiring layers 23 are alternately laminated on the photosensor 24. Namely, each of the smoothing layers 22 is laminated for smoothing an underlying surface when an upper layer is laminated. The metal optical filter 41S, the thin film filter 61, and the on-chip light-collecting element 21 are laminated on the uppermost smoothing layer 22 in that order from below. The direction of lamination of the metal optical filter 41S and the thin film filter 61 is the propagation direction (incidence direction) of electromagnetic waves in the solid-state imaging device 31.

The thin film filter 61 is an inorganic material filter using the wavelength dependence of absorption coefficient of a material. As the material of the thin film filter 61, for example, amorphous silicon may be used. Other examples which may be used as the material of the thin film filter 61 include inorganic materials such as polysilicon, single crystal silicon, and the like; inorganic materials composed of these materials as main components; inorganic compounds such as titanium oxide, tantalum oxide, niobium oxide, and the like; and the like.

The thin film filter 61 has the physical property that the absorption coefficient decreases as the wavelength increases. Therefore, the thin film filter 61 is allowed to function as a long-pass filter which transmits only an electromagnetic wave at a wavelength of the second threshold value or more. Further, any desired frequency may be set as the second threshold value by adjusting the thickness of the thin film filter 61. As a result, the function as a band-pass filter with a desired frequency band may be realized by combining the thin film filter 61 and the metal optical filter 41S.

Figure 10:
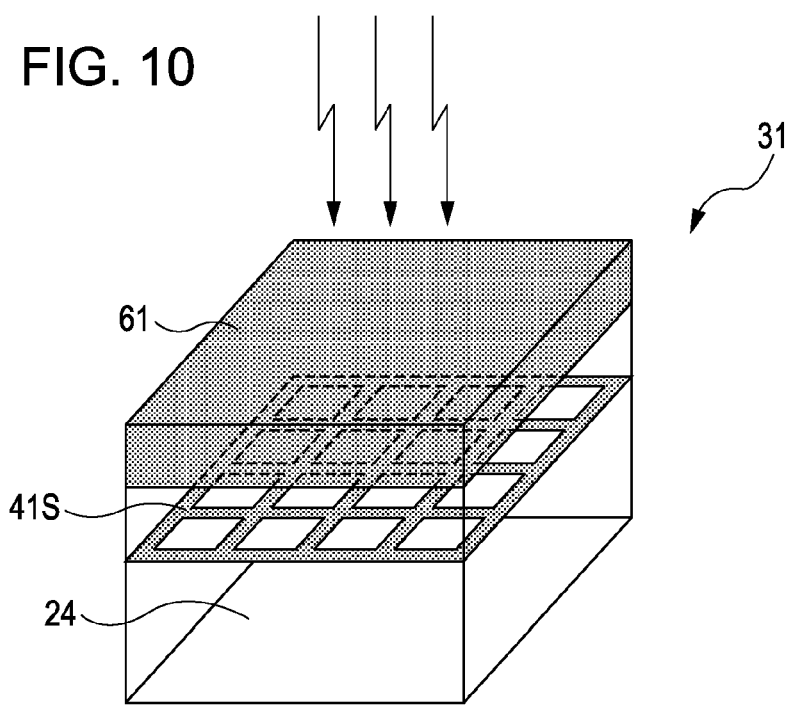
FIG. 10 is a perspective view showing the pixel portion of the solid-state imaging device shown in FIG. 9, in which an on-chip light collecting element, a smoothing layer, and metal wiring are not shown.

FIG. 10 is a perspective view showing the pixel portion of the solid-state imaging device 31 shown in FIG. 9, in which the on-chip light collecting element 21, the smoothing layers 22, and the metal wiring 23 are not shown.

Of light incident on the solid-state imaging device 31 from an upper portion in FIG. 10, a component at a short wavelength of less than the second threshold value is reflected or absorbed by the thin film filter 61, and only a component at a wavelength of the second threshold value or more is transmitted. Of the light component transmitted through the thin film filter 61, a component at a long wavelength exceeding the first threshold value is reflected or absorbed by the metal optical filter 41S, and only a component at a wavelength of the first threshold value or less is transmitted. As a result, of the light incident on the solid-state imaging device 31, only a component at a wavelength of the first threshold value or less and the second threshold value or more reaches the photosensor 24, and only the reaching component is photoelectrically converted by the photosensor 24.

Therefore, a band-pass filter which transmits only a component at a wavelength of the first threshold value or less and the second threshold value or more is easily realized by laminating the thin film filter 61 and the metal optical filter 41S.

Figure 11:
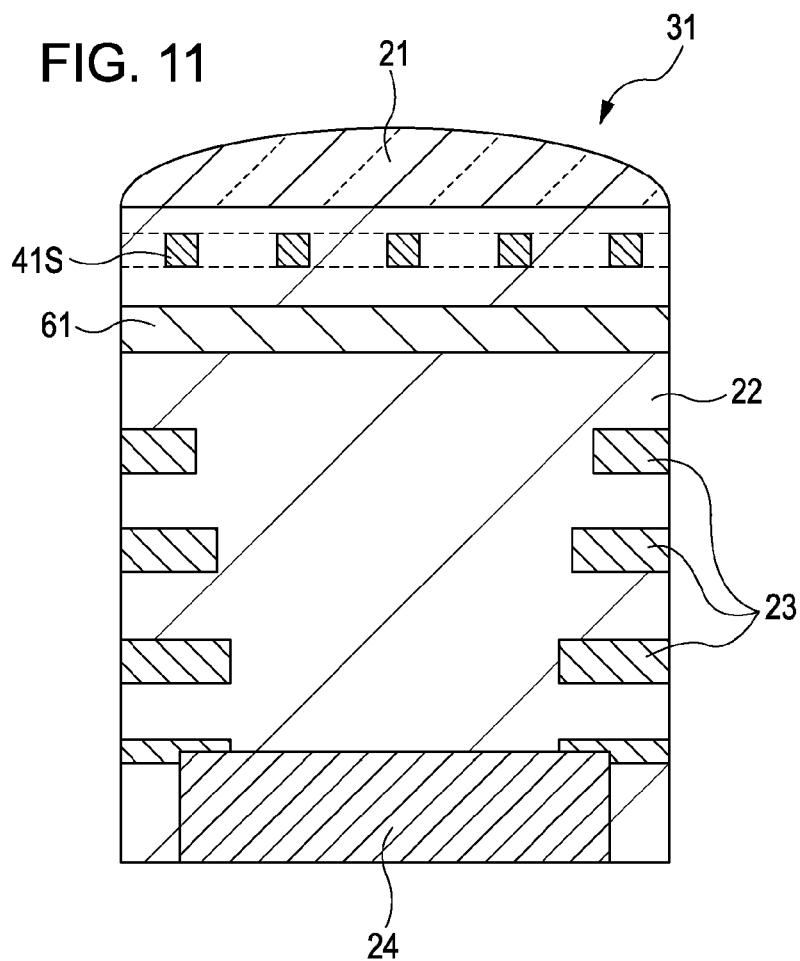
FIG. 11 is a sectional view showing an example of the configuration of the pixel portion of the solid-state imaging device according to the second embodiment of the present invention, the example being different from that shown in FIG. 9.

FIG. 11 is a sectional view showing an example of the configuration of the pixel portion of the solid-state imaging device 31 according to the second embodiment of the present invention, this example being different from that shown in FIG. 9.

In the example shown in FIG. 11, the pixel portion of the solid-state imaging device 31 has a configuration in which the positions of the metal optical filter 41S and the thin film filter 61 of the example shown in FIG. 9 are interchanged. In other words, the pixel portion of the solid-state imaging device 31 of the example shown in FIG. 11 has a configuration in which the thin film filter 61 is used in place of the metal optical filter 41L of the example shown in FIG. 3.

In the pixel portion of the solid-state imaging device 31, the photosensor 24 is disposed at the bottom, and the four smoothing layers 22 and the three metal wiring layers 23 are alternately laminated on the photosensor 24. Namely, each of the smoothing layers 22 is laminated for smoothing an underlying surface when an upper layer is laminated. The thin film filter 61, the metal optical filter 41S, and the on-chip light-collecting element 21 are laminated on the uppermost smoothing layer 22 in that order from below. The direction of lamination of the thin film filter 61 and the metal optical filter 41S is the propagation direction (incidence direction) of electromagnetic waves in the solid-state imaging device 31.

Figure 12:
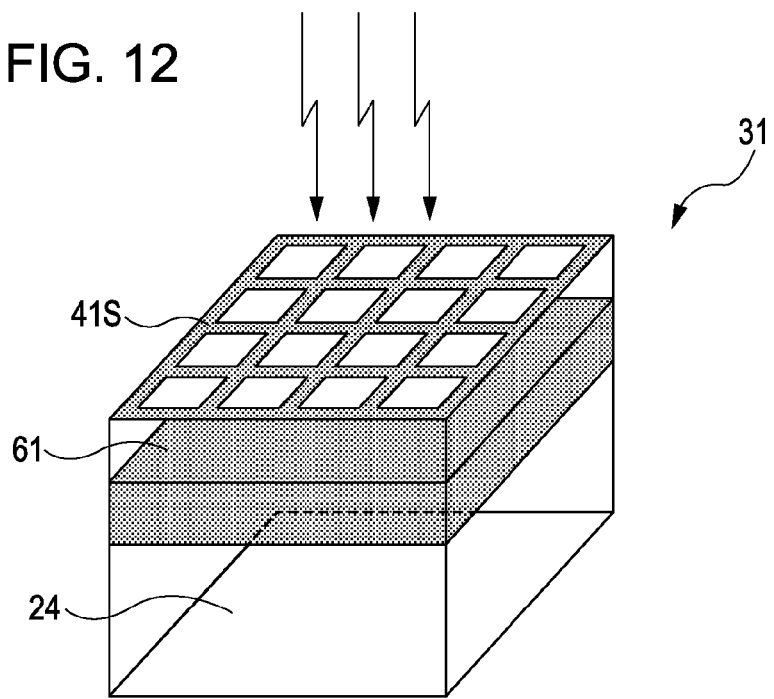
FIG. 12 is a perspective view showing the pixel portion of the solid-state imaging device shown in FIG. 11, in which an on-chip light collecting element, a smoothing layer, and metal wiring are not shown.

FIG. 12 is a perspective view showing the pixel portion of the solid-state imaging device 31 shown in FIG. 11, in which the on-chip light collecting element 21, the smoothing layers 22, and the metal wiring 23 are not shown.

Of light incident on the solid-state imaging device 31 from an upper portion in FIG. 12, a component at a long wavelength exceeding the first threshold value is reflected or absorbed by the metal optical filter 41S, and only a component at a wavelength of the first threshold value or less is transmitted. Of the light component transmitted through the metal optical filter 41S, a component at a short wavelength of less than the second threshold value is reflected or absorbed by the thin film filter 61, and only a component at a wavelength of the second threshold value or more is transmitted. As a result, of the light incident on the solid-state imaging device 31, only a component at a wavelength of the first threshold value or less and the second threshold value or more reaches the photosensor 24, and only the reaching component is photoelectrically converted by the photosensor 24.

Therefore, a band-pass filter which transmits only a component at a wavelength of the first threshold value or less and the second threshold value or more is easily realized by laminating the metal optical filter 41S and the thin film filter 61.

5. Solid-State Imaging Device According to Third Embodiment of the Present Invention FIGS. 13 and 14 are sectional views showing two respective examples of a configuration of a pixel portion of a solid-state imaging device 31 according to a third embodiment of the present invention.

Figure 13:
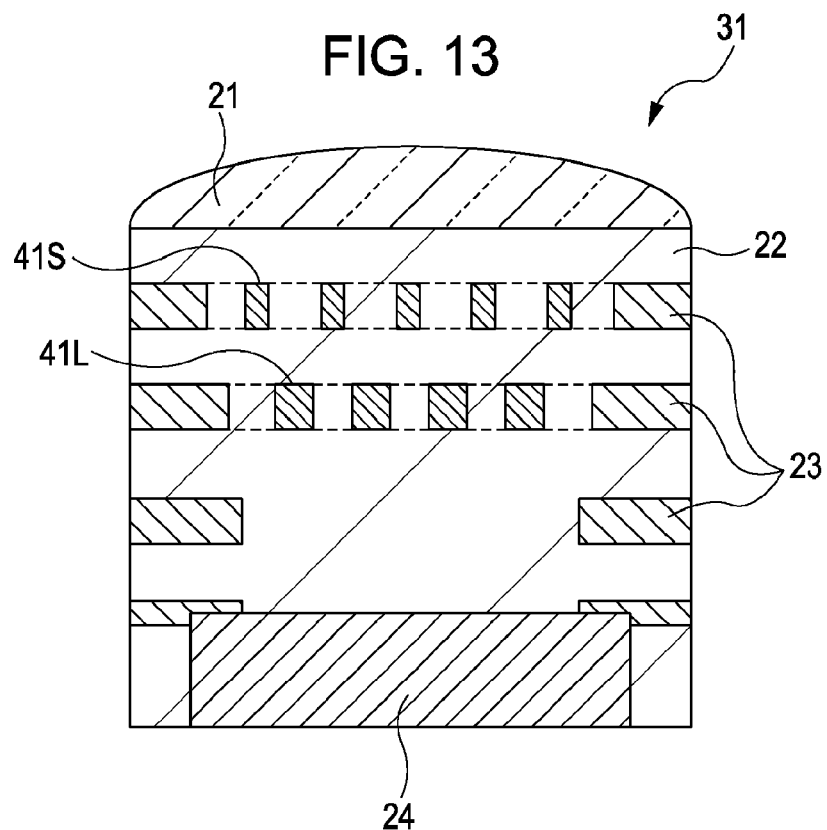
FIG. 13 is a sectional view showing an example of a configuration of a pixel portion of a solid-state imaging device according to a third embodiment of the present invention.
Figure 14:
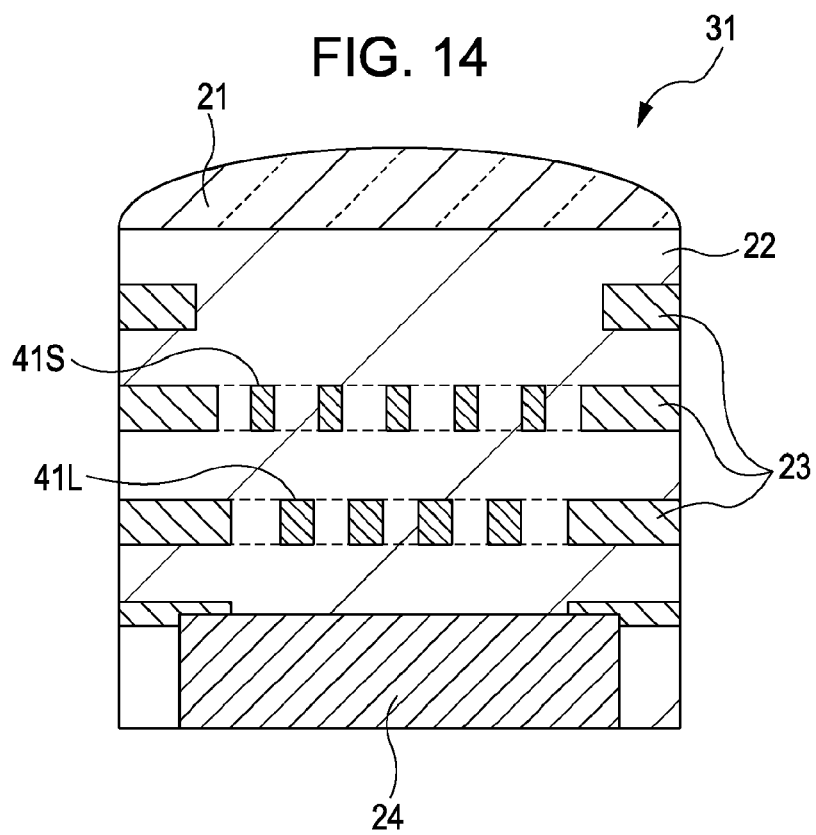
FIG. 14 is a sectional view showing another example of the configuration of the pixel portion of the solid-state imaging device according to the third embodiment of the present invention.

In each of the examples shown in FIGS. 13 and 14, the components of the pixel portion of the solid-state imaging device 31 are the same as in the examples shown in FIGS. 3 and 7.

However, in each of the examples shown in FIGS. 13 and 14, the arrangement of the metal optical filters 41S and 41L is different from that in the examples shown in FIGS. 3 and 7 as follows.

In the pixel portion of the solid-state imaging device 31 of each of the examples shown in FIGS. 13 and 14, the photosensor 24 is disposed at the bottom, and the four smoothing layers 22 and the three metal wiring layers 23 are alternately laminated on the photosensor 24.

In the example shown in FIG. 13, the metal optical filter 41L is disposed in the same layer as the metal wiring 23 in the second layer from below, and the metal optical filter 41S is disposed in the same layer as the metal wiring 23 in the third layer from below.

In the example shown in FIG. 14, the metal optical filter 41L is disposed in the same layer as the metal wiring 23 in the first layer from below, and the metal optical filter 41S is disposed in the same layer as the metal wiring 23 in the second layer from below.

In the pixel portion of the solid-state imaging device 31 of each of the examples shown in FIGS. 13 and 14, the metal optical filters 41S and 41L are mounted in the same layer as the metal wiring 23. In addition, the on-chip light-collecting element 21 is laminated on the uppermost smoothing layer 22.

Each of the metal optical filters 41S and 41L is an optical element in which electromagnetic wave energy is selectively reflected or absorbed by a conductor containing free electrons to extract an electromagnetic wave of a desired wavelength component as a transmitted light component. Therefore, in the case of a CMOS image sensor which is a usual field-amplifying solid-state imaging device, if a metal layer is disposed on the upper surface of a light-receiving portion, an electrically conductive metal thin film is not newly mounted. This is because when an electrically conductive metal layer is disposed on the upper surface of a light-receiving portion, the metal layer may also function as the electrically conductive metal thin film. A metal layer in which the metal optical filter 41 is inserted is not particularly limited. In the case of a solid-state imaging device including three metal wiring layers as shown in FIG. 13, the whole of the solid-state imaging device 31 may be formed in a low profile structure by inserting metal optical filters 41 in desired two of the layers.

Figure 15:
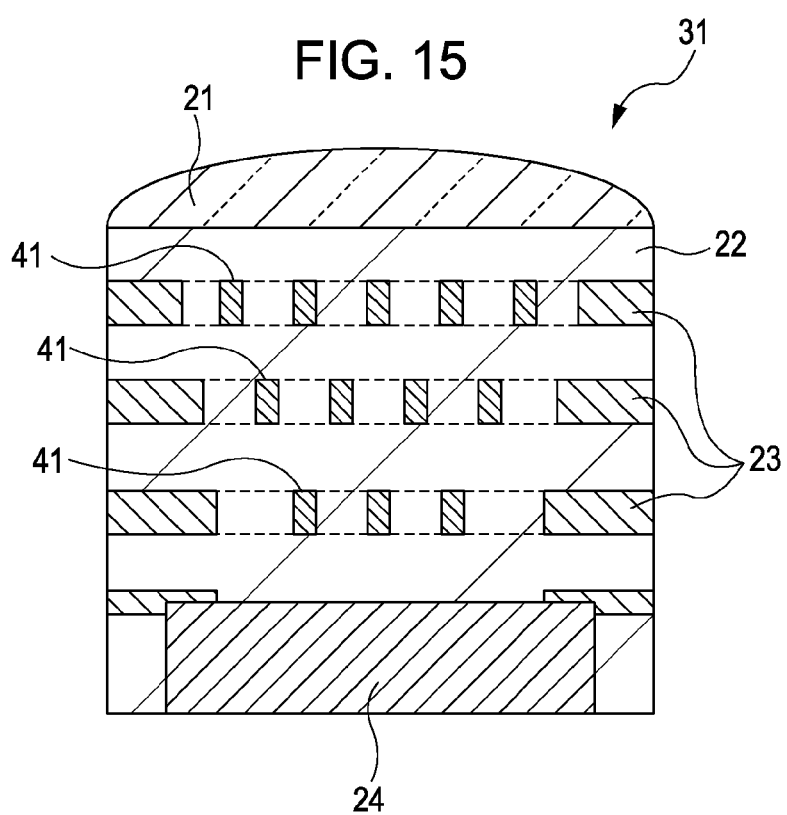
FIG. 15 is a sectional view showing an example of the configuration of the pixel portion of the solid-state imaging device according to the third embodiment of the present invention, the example being different from those shown in FIGS. 13 and 14.

FIG. 15 is a sectional view showing an example of the configuration of the pixel portion of the solid-state imaging device 31 according to the third embodiment of the present invention, this example being different from those shown in FIGS. 13 and 14.

In comparison of the example shown in FIG. 15 with the examples shown in FIGS. 13 and 14, in the examples shown in FIGS. 13 and 14, the metal optical filters 41L and 41S are provided in two layer, while in the example shown in FIG. 15, metal optical filters 41 are provided in three layers.

The reason of using the term "metal optical filters 41" is that it is sufficient to dispose at least one of each of the metal optical filters 41L and 41S. That is, either the metal optical filter 41L or 41S may be disposed in the remaining layer, and the arrangement of the metal optical filters 41L and 41S in the three layers is not particularly limited.

In the pixel portion of the solid-state imaging device 31, the photosensor 24 is disposed at the bottom, and the four smoothing layers 22 and the three metal wiring layers 23 are alternately laminated on the photosensor 24. Namely, each of the smoothing layers 22 is laminated for smoothing an underlying surface when an upper layer is laminated. The metal optical filters 41 are disposed in the same layers as the respective three metal wiring layers 23. The on-chip light-collecting element 21 is laminated on the uppermost smoothing layer 22.

As described above, a conductor layer including the same metal optical filters 41 provided in two layers, i.e., a conductor layer having the same conductor structures provided in two layer, is expected to function as a Fabry-Perot interferometer and have the property of transmitting an electromagnetic wave at a specified resonance frequency. In addition, a band pass filter having a narrower band width than that of a band pass filter realized by two conductor layers may be realized by further providing another metal optical filter 41 as a downstream layer.

Figure 16:
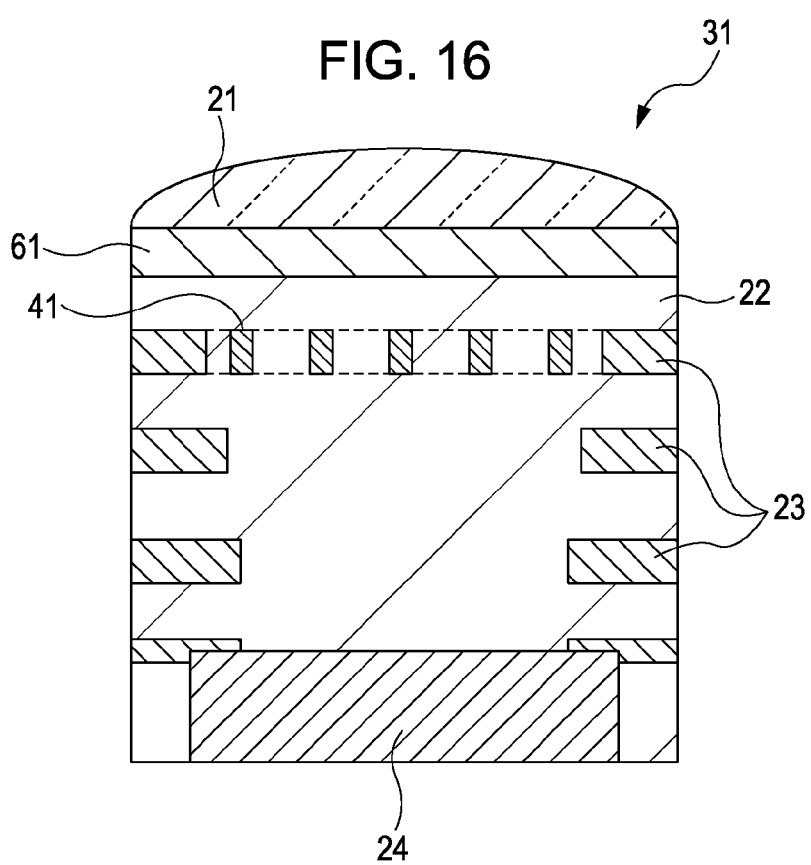
FIG. 16 is a sectional view showing an example of the configuration of the pixel portion of the solid-state imaging device according to the third embodiment of the present invention, the example being different from those shown in FIGS. 13 to 15.

FIG. 16 is a sectional view showing an example of the configuration of the pixel portion of the solid-state imaging device 31 according to the third embodiment of the present invention, this example being different from those shown in FIGS. 13 to 15.

In comparison of the example shown in FIG. 16 with the examples shown in FIGS. 13 to 15, in the examples shown in FIGS. 13 to 15, the metal optical filters 41 are used as all color filters, while in the example shown in FIG. 16, a metal optical filter 41 and a thin film filter 61 are used as color filters.

Although the example shown in FIG. 16 is included in the third embodiment because the metal optical filter 41 is disposed in a metal layer, the example may be included in the second embodiment because the thin film filter 61 is used. In other words, the example shown in FIG. 16 may be considered as another embodiment including both the second embodiment and the third embodiment.

Although not shown in the drawing, of course, the number of color filter layers is not limited to two of the example shown in FIG. 16, and the number may be one or three or more as in the example shown in FIG. 15.

In the first to third embodiments, the configurations shown in FIGS. 5 and 6 are used as the configurations of the metal optical filters 41S and 41L. However, the configurations of the metal optical filters 41S and 41L are not particularly limited to the configurations shown in FIGS. 5 and 6. Therefore, metal optical filters 41S and 41L having configurations different from those shown in FIGS. 5 and 6 are described as a fourth embodiment in which the method of the present invention is applied to a solid-state imaging device.

As the arrangement of the metal optical filters 41S and 41L in the solid-state imaging device described below, any one of the arrangement examples of the above-described first to third embodiments may be used. That is, instead of the configurations shown in FIGS. 5 and 6, the configurations described below may be used as configurations of the metal optical filters 41S and 41L which are mounted in the solid-state imaging device according to any one of the first to third embodiments.

Figure 17:
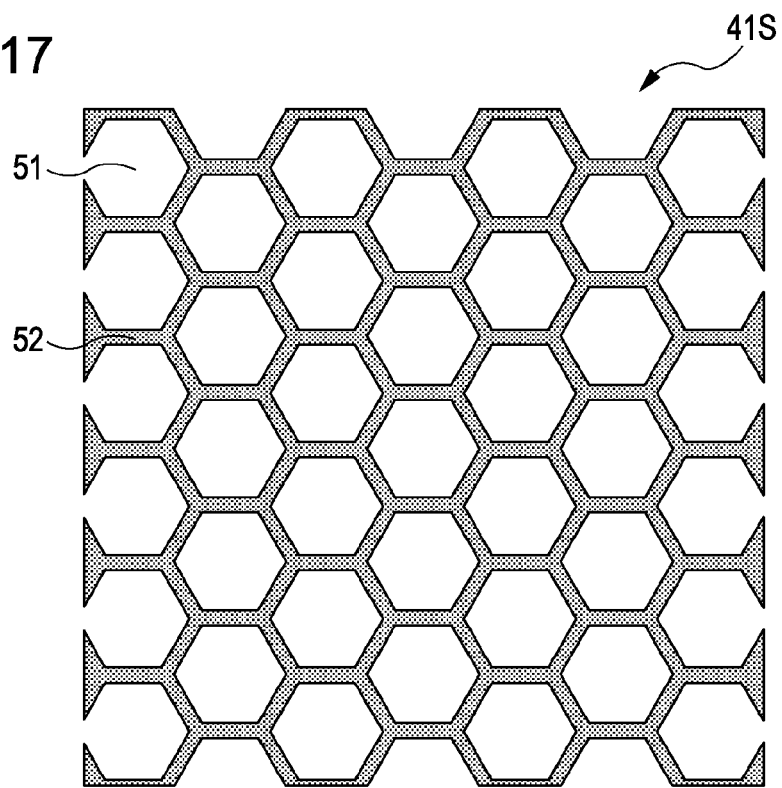
FIG. 17 is a top view showing an example of a configuration of a metal optical filter functioning as a short pass filter, the example being different from that shown in FIG. 5.

FIG. 17 is a top view showing an example of a configuration of the metal optical filter 41S functioning as a short-pass filter, the example being different from the example shown in FIG. 5.

As shown in FIG. 17, the metal optical filter 41S includes a metallic portion 52 and a medium portion 51. The metallic portion 52 has a so-called honeycomb structure. The metallic portion 52 is composed of an electrically conductive metal thin film. With respect to the material of each of the metallic portion 52 and the medium portion 51, the material described with reference to FIG. 5 may be directly used.

Figure 18:
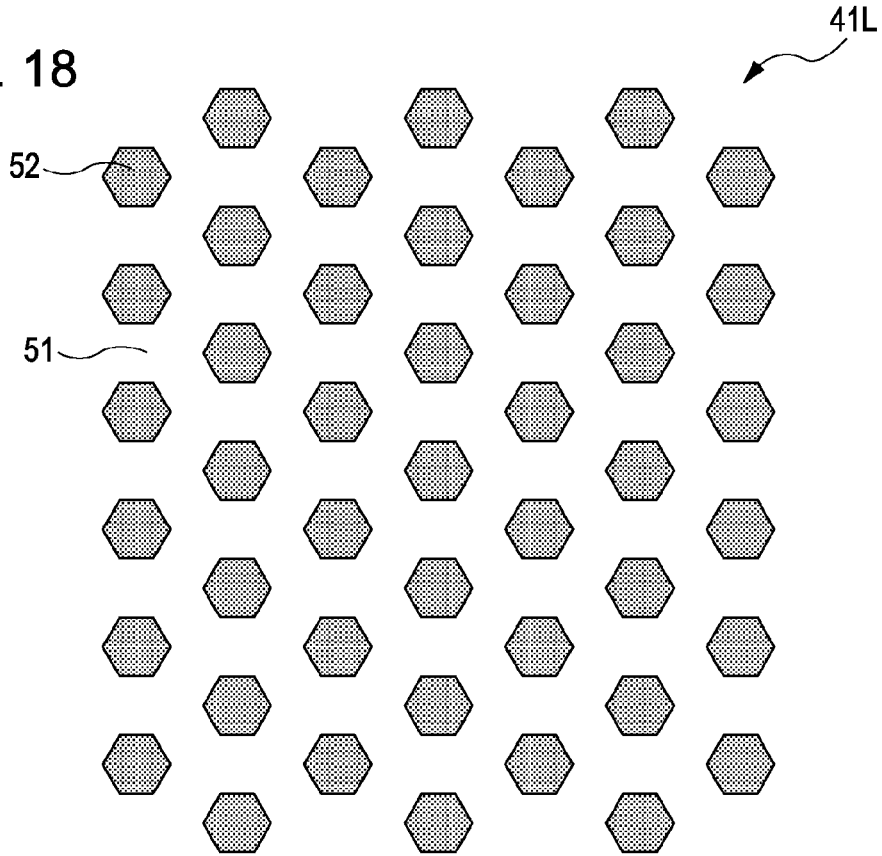
FIG. 18 is a top view showing an example of a configuration of a metal optical filter functioning as a long pass filter, the example being different from that shown in FIG. 6.

FIG. 18 is a top view showing an example of a configuration of the metal optical filter 41L functioning as a long-pass filter, the example being different from the example shown in FIG. 6.

As shown in FIG. 18, the metal optical filter 41L has a basic structure in which the metallic portion 52 and the medium portion 51 of the metal optical filter 41S shown in FIG. 17 are reversed. With respect to the material of each of the metallic portion 52 and the medium portion 51, the material described with reference to FIG. 5 may be directly used.

As the configurations of the metal optical filters 41, a configuration in which circular holes are arranged in a square matrix or in a close-packed lattice pattern and a reversed configuration thereof, a configuration in which cross-shaped holes are arranged and a reversed configuration thereof, or the like may be used.

The examples of the configuration of the pixel portion of the solid-state imaging device 31 are described above. An arrangement of the pixel portions is not particularly limited, and for example, the arrangement shown in FIG. 19 is preferably used.

Figure 19:
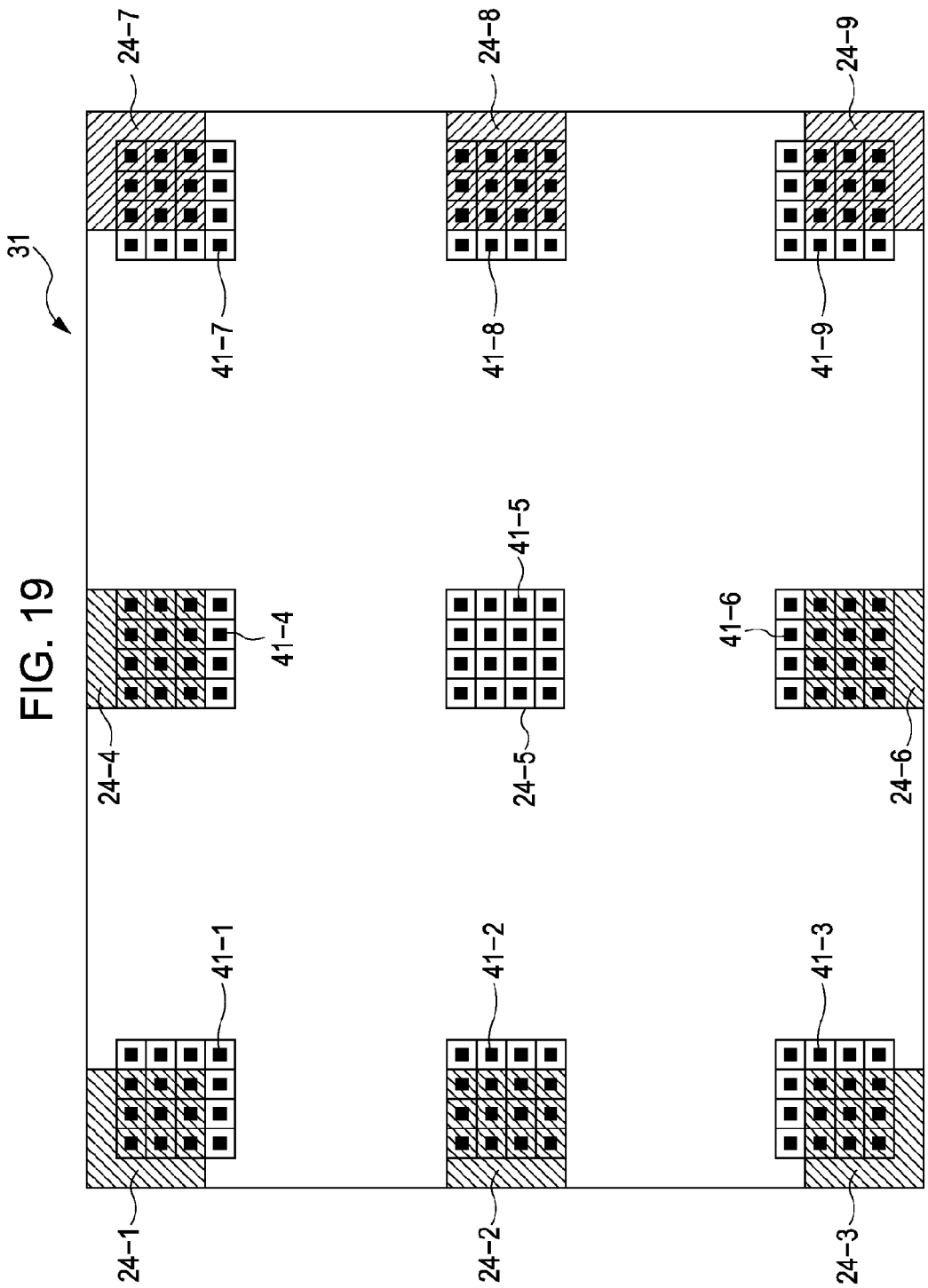
FIG. 19 is a top view showing an arrangement example of pixels in a solid-state imaging device of a predetermined size.

FIG. 19 is a top view showing an arrangement example of pixels in the solid-state imaging device 31 of a predetermined size.

In the example shown in FIG. 19, only photosensors 24-1 to 24-9 serving as pixels are shown in order to facilitate description. Namely, in fact, photosensors are arranged in a matrix in the number of pixels possessed by the solid-state imaging device 31.

In addition, metal optical filters 41-1 to 41-9 are laminated on the photosensors 24-1 to 24-9, respectively. Since FIG. 19 is a top view, each of the metal optical filters 41-1 to 41-9 indicates the metal optical filter 41 in the top layer of each pixel portion. That is, although not shown in FIG. 19, of course, at least one other color filter is laminated below each of the metal optical filters 41-1 to 41-9.

As shown in FIG. 19, the positions of the photosensor 24-5 and the metal optical filter 41-5 arranged at the center of the solid-state imaging device 31 coincide with each other. That is, the optical axes of the photosensor 24-5 and the metal optical filter 41-5 coincide with each other. On the other hand, the positions of the photosensor 24-1 and the metal optical filter 41-1 arranged at the upper left corner of the drawing have a positional relationship in which the metal optical filter 41-1 is offset to the central pixel (to the lower right). In addition, the positions of the photosensor 24-9 and the metal optical filter 41-9 arranged at the lower right corner of the solid-state imaging device 31 in the drawing have a positional relationship in which the metal optical filter 41-9 is offset to the central pixel (to the upper left).

As described above, in a peripheral pixel portion, in order to efficiently lead oblique incident light to the photosensor 24, the method of laminating the photosensor 24 and the metal optical filter 41 is preferably changed according to the distance from the center. That is, it is preferred to use a positional relationship in which the position of the metal optical filter 41 laminated on the photosensor 24 is offset to the central portion according to the distance from the central portion. This is because even in the solid-state imaging device 31 subjected to pupil correction, incident light is evenly led to the photosensors 24 with high efficiency regardless of positions such as the central portion and the peripheral region of the solid-state imaging device 31.

The first to fourth embodiments are described as an embodiment in which the method of the present invention is applied to a solid-state imaging device.

In the present invention, however, it is sufficient to use two or more color filters as on-chip color filters and use a metal optical filter 41 as at least one of the color filters. That is, the present invention is not limited to the above-described first to fourth embodiments, and various embodiments may be made.

Use of the method of the present invention exhibits, for example, the following first to fourth advantages.

The first advantage is that since a band-pass filter function is realized by a lattice structure, the color filters are chemically stable as compared with a usual organic color filter using a pigment, a dye, or the like. As a result, resistance to high-energy light such as ultraviolet light and the like is enhanced.

Since a conductor may be used as the material of the lattice, the second advantage of a high degree of freedom of material selection is exhibited. In addition, a wavelength transmitted may be selected by physical property parameters such as the lattice spacing, the thin film spacing, and the like, the degree of freedom of design is increased. Further, from the viewpoint that differences between solids and manufacturing variation depend on processing accuracy, there is the advantage of easy control of characteristics.

In a CCD/CMOS image sensor which is a currently mainstream solid-state imaging device, a plurality of metal wiring layers are mounted on the upper surface of a photosensor. There is also the third advantage that the optical element of the present invention may be mounted by a usual semiconductor manufacturing process and is thus superior to a usual organic color filter manufactured by a particular process from the viewpoint of cost.

There is further exhibited the fourth advantage that since the typical thickness of a conductor thin film is about 100 nm, lowering of the profile is good as compared with a usual organic color filter. Further, when the optical element is mounted in the same layer as the metal wiring layer, the structure may be formed in a profile lower than a usual CMOS image sensor by a thickness corresponding to the color filters. Consequently, there is priority to a usual organic color filter from the viewpoint of light collecting characteristics.

The above-described first to fourth advantages are summarized, resulting in the advantage that a technique of selectively extracting a specified electromagnetic wavelength may be realized by a chemically stable, low-cost, low-profile structure.

A solid-state imaging device according to an embodiment of the present invention may be applied to camera portions of various electronic apparatuses having a photographing function. Examples of the electronic apparatuses include a digital still camera, a digital video camera, a notebook-size personal computer, a cellular phone, and the like. A solid-state imaging device according to an embodiment of the present invention may be applied to camera portions of electronic apparatuses in any field in which an image or picture is photographed on the basis of video signals input into electronic apparatuses or generated therein. Examples of electronic apparatuses to which such a camera is applied are described below.

For example, the present invention may be applied to a digital still camera as an example of electronic apparatuses. The digital still camera is manufactured to include a solid-state imaging device according to an embodiment of the present invention in addition to a pick-up lens, a display portion, a control switch, a menu switch, a shutter, and the like.

For example, the present invention may be applied to a notebook-size personal computer as an example of electronic apparatuses. In the notebook-size personal computer, a body includes a keyboard operated when characters and the like are input, a body cover including a camera portion. The notebook-size personal computer is manufactured using a solid-state imaging device according to an embodiment of the present invention in the camera portion.

For example, the present invention may be applied to a portable terminal device as an example of electronic apparatuses. The portable terminal device includes an upper casing and a lower casing. The portable terminal device takes a state in which the two casings are opened and a state in which the two casings are closed. Besides the upper casing and the lower casing, the portable terminal device includes a connecting portion (herein, a hinge), a display, a sub-display, a picture light, a camera portion, and the like. The portable terminal device is manufactured by using a solid-state imaging device according to an embodiment of the present invention in the camera portion.

For example, the present invention may be applied to a digital video camera as an example of electronic apparatuses. The digital video camera is manufactured to include a solid-state imaging device according to an embodiment of the present invention in addition to a body portion, an object photographing lens provided on the side facing forward, a photographing start/stop switch, and a monitor.

The present application contains subject matter related to that disclosed in Japanese Priority Patent Application JP 2009-004457 filed in the Japan Patent Office on Jan. 13, 2009, the entire content of which is hereby incorporated by reference.

Embodiments of the present invention are not limited to the above-described first to fourth embodiments, and various modifications may be made within the scope of the gist of the present invention.

What is claimed is:

1. An optical element comprising:
  a first filter operable to transmit a first component at a lower frequency than a first cutoff frequency in incident light;
  a second filter operable to transmit a second component at a higher frequency than a second cutoff frequency in the incident light; and
  a light-receiving element operable to photoelectrically convert the first and second components transmitted through the first filter and the second filter in the incident light,
  wherein, at least one of the first filter and the second filter is a metal optical filter having a conductor thin film, and the metal optical filter includes a metallic lattice portion composed of the conductor thin film, a gap portion of the metallic lattice portion is filled with a medium operable to transmit an electromagnetic wavelength to which the optical element has sensitivity.

2. A solid-state imaging device comprising:

a plurality of optical elements arranged as pixels in a matrix, the optical elements each including (i) a first filter operable to transmit a first component at a lower frequency than a first cutoff frequency in incident light, (ii) a second filter operable to transmit a second component at a higher frequency than a second cutoff frequency in the incident light, and (iii) a light-receiving element operable to photoelectrically convert the first and second components transmitted through the first filter and the second filter in the incident light, wherein, at least one of the first filter and the second filter is a metal optical filter having a conductor thin film, and the metal optical filter includes a metallic lattice portion composed of the conductor thin film, a gap portion of the metallic lattice portion is filled with a medium operable to transmit an electromagnetic wavelength to which the solid-state imaging device has sensitivity.

3. The solid-state imaging device according to claim 2, wherein one of the metallic portion and the medium portion in the metal optical filter has a lattice- or honeycomb-like distribution structure.

4. The solid-state imaging device according to claim 3, wherein the lattice- or honeycomb-like distribution structure in the metal optical filter is determined on the basis of a wavelength in the medium corresponding to the first cutoff frequency or the second cutoff frequency.

5. The solid-state imaging device according to claim 2, wherein each of the optical elements further includes at least one filter having the function of the first filter or the second filter.

6. The solid-state imaging device according to claim 2, wherein the first filter and the second filter are stacked in the incidence direction of the incident light.

7. The solid-state imaging device according to claim 6, wherein each of the optical elements further includes an on-chip light-collecting element, the first filter and the second filter being disposed between the on-chip light-collecting element and the light-receiving element.

8. The solid-state imaging device according to claim 7, wherein each of the optical elements further includes a metal wiring layer between the on-chip light-collecting element and the light-receiving element, the first filter and the second filter being disposed in the metal wiring layer.

9. The solid-state imaging device according to claim 8, wherein each of the optical elements is disposed in the same layer as the metal wiring layer.

10. The solid-state imaging device according to claim 2, wherein:

the light-receiving element and the first filter and the second filter share an optical axis in a central portion of the solid-state imaging device, and the light-receiving element and the first and second filters in an outer portion of the solid-state imaging device is offset toward the central portion based on a distance of the outer portion from the central portion.

* * * * *